(12) United States Patent
Rao et al.

(10) Patent No.: US 12,346,229 B2
(45) Date of Patent: Jul. 1, 2025

(54) SYSTEM AND METHOD FOR AUTOMATED LOOP CHECKING

(71) Applicant: Honeywell International Inc., Charlotte, NC (US)

(72) Inventors: Chetan Prahlada Rao, Bangalore (IN); Nagaraju Maleppagari, Anantappur (IN); Sathesh Venkatachalam, Namakkal (IN); Rahul De, Bangalore (IN); Ananda H, Bangalore (IN); Varun Prabhakar, Bangalore (IN); Dawa Ongpo Pakimo, Bengalore (IN); Sathya Muthu Mani, Bangalore (IN)

(73) Assignee: Honeywell International Inc., Charlotte, NC (US)

( * ) Notice: Subject to any disclaimer, the term of this patent is extended or adjusted under 35 U.S.C. 154(b) by 477 days.

(21) Appl. No.: 17/024,317

(22) Filed: Sep. 17, 2020

(65) Prior Publication Data

US 2021/0089417 A1   Mar. 25, 2021

(30) Foreign Application Priority Data

Sep. 23, 2019   (IN) .............................. 201911038325

(51) Int. Cl.

| | |
|---|---|
| *G06F 11/26* | (2006.01) |
| *G01R 31/67* | (2020.01) |
| *G05B 19/418* | (2006.01) |
| *G06F 11/22* | (2006.01) |
| *G06F 16/953* | (2019.01) |

(Continued)

(52) U.S. Cl.
CPC .............. *G06F 11/26* (2013.01); *G01R 31/67* (2020.01); *G05B 19/41885* (2013.01); *G06F 11/221* (2013.01); *G06F 16/953* (2019.01); *H04W 4/80* (2018.02); *G05B 2219/42058* (2013.01); *H04W 84/12* (2013.01)

(58) Field of Classification Search
None
See application file for complete search history.

(56) References Cited

U.S. PATENT DOCUMENTS

| | | | |
|---|---|---|---|
| 5,339,262 A | 8/1994 | Rostoker et al. | |
| 8,221,137 B2 * | 7/2012 | Zheng .................. | H01R 12/724 439/80 |

(Continued)

FOREIGN PATENT DOCUMENTS

WO   2017066304 A1   4/2017

OTHER PUBLICATIONS

EPO, "European Search Report", dated Feb. 4, 2021.
European Search Report for corresponding EP Application No. 20197315.3 dated Dec. 20, 2022.

*Primary Examiner* — Christopher J Fibbi
(74) *Attorney, Agent, or Firm* — Paschall & Associates, LLC; James C. Paschall; Anthony Miologos (57) ABSTRACT

A system and method for the automated checking of I/O loops of a process automation system is disclosed that includes a dongle configured to be installed on a terminal block and make an electrical connection to at least one I/O loop. Operating software communicates with the dongle and to a database of I/O loop data. The operating software constructs an I/O loop check file using the database of I/O loop data and downloads the I/O loop check file to the dongle, where the dongle uses the I/O loop check file to test the I/O loop.

18 Claims, 8 Drawing Sheets

(51) Int. Cl.
H04W 4/80 (2018.01)
H04W 84/12 (2009.01)

(56) References Cited

U.S. PATENT DOCUMENTS

| | | | |
|---|---|---|---|
| 9,736,322 B2 * | 8/2017 | Lee | H04N 1/00063 |
| 9,799,610 B2 | 10/2017 | Xu et al. | |
| 2005/0212526 A1 * | 9/2005 | Blades | G01R 31/67 |
| | | | 324/543 |
| 2007/0174751 A1 * | 7/2007 | Sulzer | G06F 11/26 |
| | | | 714/E11.159 |
| 2007/0293954 A1 * | 12/2007 | Pfingsten | H01R 13/514 |
| | | | 361/728 |
| 2015/0127876 A1 * | 5/2015 | Erni | G06F 13/4282 |
| | | | 710/315 |
| 2015/0234381 A1 * | 8/2015 | Ratilla | G01L 27/005 |
| | | | 702/104 |
| 2017/0170596 A1 * | 6/2017 | Goossens | H01R 13/00 |
| 2017/0178487 A1 * | 6/2017 | Gopisetti | G01R 31/67 |
| 2017/0257262 A1 * | 9/2017 | Dalal | H04L 41/0677 |
| 2017/0277613 A1 | 9/2017 | Sobti et al. | |
| 2018/0210429 A1 * | 7/2018 | Jundt | G05B 23/0224 |

\* cited by examiner

SYSTEM AND METHOD FOR AUTOMATED LOOP CHECKING

CROSS-REFERENCE TO RELATED APPLICATION

This application claims priority under 35 U.S.C. § 119(b) to India Provisional Patent Application No. 201911038325, filed on Sep. 23, 2019. This provisional application is hereby incorporated by reference in its entirety.

TECHNICAL FIELD

This disclosure is generally directed to industrial process control and automation systems. More specifically, this disclosure is directed to a system and method for automated checking of I/O loops.

BACKGROUND

Loop checking is the process of validating and verifying the accuracy of cables that are laid from control panels to field instruments, which ensures that the right transmitter is connect to the correct Input/Output (I/O) port of a controller. Loop checking is an important activity in a plant during installation, commissioning and maintenance phases. In many plants, loop checking is a mandatory activity that cannot be eliminated and consumes large amounts of time, cost and manpower. Loop checking requires multiple people working together to ensure that the loop is properly connected to I/O ports and a marshalling cabinet. Loop checking needs to be completed before powering up of a field instrument or marshalling cabinet.

Process Industries like oil & gas, petrochemicals, refineries etc. involves multiple stages of validation and verification in the project lifecycle. Validation and verification of input/output (I/O) loop checks need to be completed before starting the commissioning and startup of the plant. During a projects lifecycle, the validation of I/O loop check activities occur at PRE-FAT (pre-factory acceptance testing), FAT (factory acceptance test) and SAT (site acceptance test) and validate the hardwired I/O loop from the junction boxes, field termination assemblies and marshalling cabinets to field instruments. This is manually intensive, repetitive & time-consuming activity is required to demonstrate that the correct wiring and configuration has been made for each I/O channel.

When the cables are checked for failures, the cables between junction boxes, field termination assemblies are tested by detecting a signal transmitted from a control panel to specific field devices. Currently, each cable is manually tested by a group of people from a cable source (such as a marshalling cabinet) to a destination (such as a field transmitter), which is time consuming.

SUMMARY

This disclosure provides a system and method for the automated checking of I/O loops of an industrial process control and automation system.

In a first embodiment a system is provided. The system includes a dongle configured to be installed on a terminal block and to make an electrical connection to at least one I/O loop. Operating software communicate with the dongle and to a database of I/O loop data. The operating software uses the database of I/O loop data to construct an I/O loop check file. The I/O loop check file is downloaded to the dongle, where the dongle uses the I/O loop check file to test the I/O loop.

In a second embodiment a method is provided. The method includes installing a dongle on a terminal block to make an electrical connection to at least one I/O loop. The method also includes generating an I/O loop check file using operating software that communicates with the dongle and a database of I/O loop data, the operating software using the database of I/O loop data to generate the I/O loop check file. The method further includes downloading the I/O loop check file to the dongle and running the I/O loop check file testing the I/O loop.

In a third embodiment a system is provided. The system includes a terminal block having a plurality of terminal sockets the terminal sockets connected to at least one I/O loop. The system also includes dongle having an electronic section and a terminal section communicatively connected to each other. The terminal section including a plurality of pins arranged to be received by, and make electrical connections to, the terminal sockets of the terminal block. The system further includes a mobile device running operating software that wirelessly communicates with the electronic section of the dongle and to a database of I/O loop data. The operating software using the database of I/O loop data to construct an I/O loop check file. The mobile device is configured to download the I/O loop check file to the electronic section of the dongle, wherein the electronic section of the dongle executes the I/O loop check file testing the I/O loop by applying test signals through selective terminal pins and the terminal block sockets connected to the at least one I/O loop.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

The figures, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
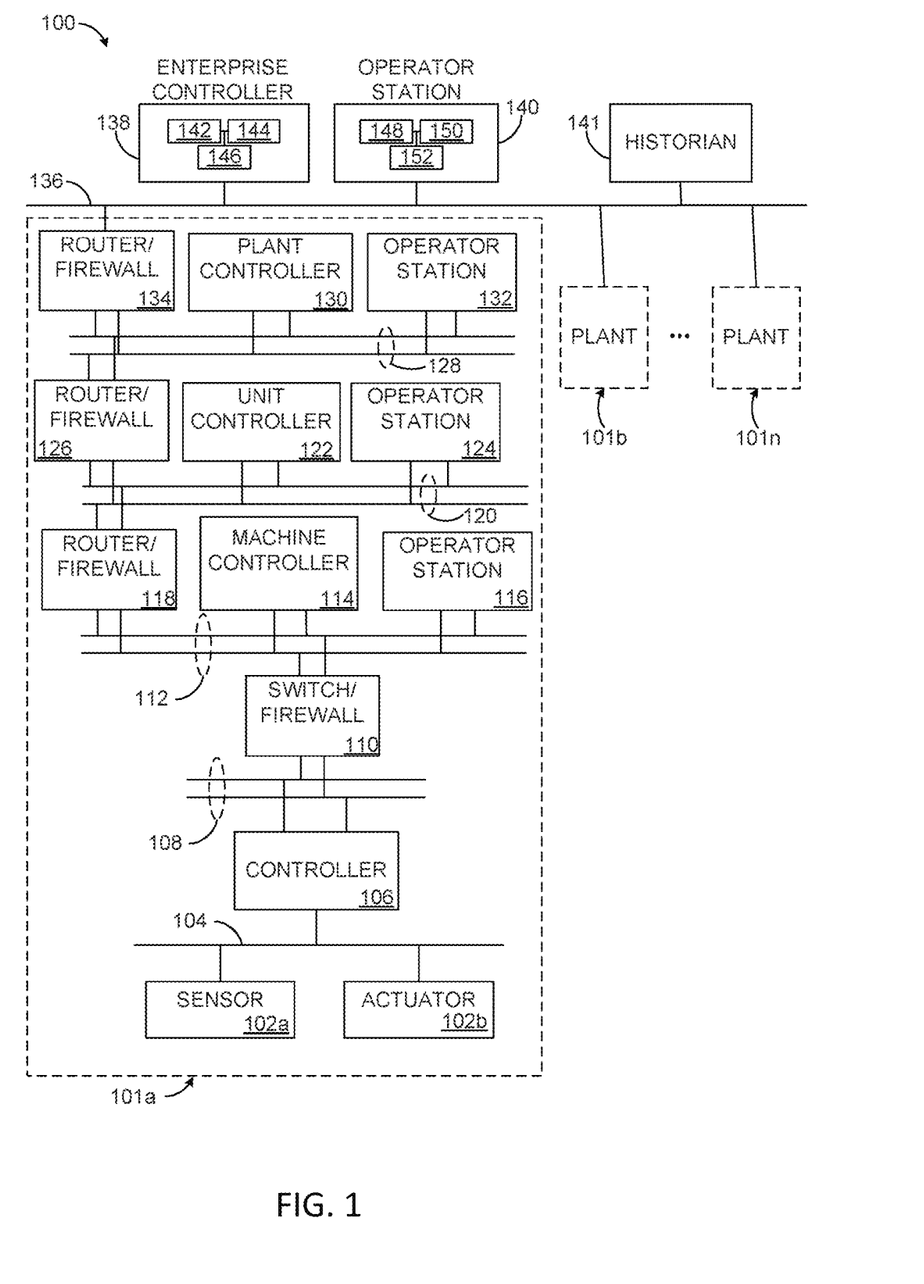
FIG. 1 illustrates an example industrial control and automation system according to this disclosure.

FIG. 1 illustrates an example industrial process control and automation system 100 according to this disclosure. As shown in FIG. 1, the system 100 includes various components that facilitate production or processing of at least one product or other material. For instance, the system 100 is used here to facilitate control over components in one or multiple plants 101a-101n. Each plant 101a-101n represents one or more processing facilities (or one or more portions thereof), such as one or more manufacturing facilities for producing at least one product or other material. In general, each plant 101a-101n may implement one or more processes and can individually or collectively be referred to as a process system. A process system generally represents any system or portion thereof configured to process one or more products or other materials in some manner.

In FIG. 1, the system 100 is implemented using the Purdue model of process control. In the Purdue model, "Level 0" may include one or more sensors 102a and one or more actuators 102b. The sensors 102a and actuators 102b represent components in a process system that may perform any of a wide variety of functions. For example, the sensors 102a could measure a wide variety of characteristics in the process system, such as temperature, pressure, flow rate, or a voltage transmitted through a cable. Also, the actuators 102b could alter a wide variety of characteristics in the process system. The sensors 102a and actuators 102b could represent any other or additional components in any suitable process system. Each of the sensors 102a includes any suitable structure for measuring one or more characteristics in a process system. Each of the actuators 102b includes any suitable structure for operating on or affecting one or more conditions in a process system.

At least one network 104 is coupled to the sensors 102a and actuators 102b. The network 104 facilitates interaction with the sensors 102a and actuators 102b. For example, the network 104 could transport measurement data from the sensors 102a and provide control signals to the actuators 102b. The network 104 could represent any suitable network or combination of networks. As particular examples, the network 104 could represent an Ethernet network, an electrical signal network (such as a HART or FOUNDATION FIELDBUS (FF) network), a pneumatic control signal network, or any other or additional type(s) of network(s).

In the Purdue model, "Level 1" may include one or more controllers 106, which are coupled to the network 104. Among other things, each controller 106 may use the measurements from one or more sensors 102a to control the operation of one or more actuators 102b. For example, a controller 106 could receive measurement data from one or more sensors 102a and use the measurement data to generate control signals for one or more actuators 102b. Multiple controllers 106 could also operate in redundant configurations, such as when one controller 106 operates as a primary controller while another controller 106 operates as a backup controller (which synchronizes with the primary controller and can take over for the primary controller in the event of a fault with the primary controller). Each controller 106 includes any suitable structure for interacting with one or more sensors 102a and controlling one or more actuators 102b. Each controller 106 could, for example, represent a multivariable controller, such as a Robust Multivariable Predictive Control Technology (RMPCT) controller or other type of controller implementing model predictive control (MPC) or other advanced predictive control (APC). As a particular example, each controller 106 could represent a computing device running a real-time operating system.

Two networks 108 are coupled to the controllers 106. The networks 108 facilitate interaction with the controllers 106, such as by transporting data to and from the controllers 106. The networks 108 could represent any suitable networks or combination of networks. As particular examples, the networks 108 could represent a pair of Ethernet networks or a redundant pair of Ethernet networks, such as a FAULT TOLERANT ETHERNET (FTE) network from HONEYWELL INTERNATIONAL INC.

At least one switch/firewall 110 couples the networks 108 to two networks 112. The switch/firewall 110 may transport traffic from one network to another. The switch/firewall 110 may also block traffic on one network from reaching another network. The switch/firewall 110 includes any suitable structure for providing communication between networks, such as a HONEYWELL CONTROL FIREWALL (CF9) device. The networks 112 could represent any suitable networks, such as a pair of Ethernet networks or an FTE network.

In the Purdue model, "Level 2" may include one or more machine-level controllers 114 coupled to the networks 112. The machine-level controllers 114 perform various functions to support the operation and control of the controllers 106, sensors 102a, and actuators 102b, which could be associated with a particular piece of industrial equipment (such as a boiler or other machine). For example, the machine-level controllers 114 could log information collected or generated by the controllers 106, such as measurement data from the sensors 102a or control signals for the actuators 102b. The machine-level controllers 114 could also execute applications that control the operation of the controllers 106, thereby controlling the operation of the actuators 102b. In addition, the machine-level controllers 114 could provide secure access to the controllers 106. Each of the machine-level controllers 114 includes any suitable structure for providing access to, control of, or operations related to a machine or other individual piece of equipment. Each of the machine-level controllers 114 could, for example, represent a server computing device running a MICROSOFT WINDOWS operating system. Although not shown, different machine-level controllers 114 could be used to control different pieces of equipment in a process system (where each piece of equipment is associated with one or more controllers 106, sensors 102a, and actuators 102b).

One or more operator stations 116 are coupled to the networks 112. The operator stations 116 represent computing or communication devices providing user access to the machine-level controllers 114, which could then provide user access to the controllers 106 (and possibly the sensors 102a and actuators 102b). As particular examples, the operator stations 116 could allow users to review the operational history of the sensors 102a and actuators 102b using information collected by the controllers 106 and/or the machine-level controllers 114. The operator stations 116 could also allow the users to adjust the operation of the sensors 102a, actuators 102b, controllers 106, or machine-level controllers 114. In addition, the operator stations 116 could receive and display warnings, alerts, or other messages or displays generated by the controllers 106 or the machine-level controllers 114. Each of the operator stations 116 includes any suitable structure for supporting user access and control of one or more components in the system 100. Each of the operator stations 116 could, for example, represent a computing device running a MICROSOFT WINDOWS operating system.

At least one router/firewall 118 couples the networks 112 to two networks 120. The router/firewall 118 includes any suitable structure for providing communication between networks, such as a secure router or combination router/firewall. The networks 120 could represent any suitable networks, such as a pair of Ethernet networks or an FTE network.

In the Purdue model, "Level 3" may include one or more unit-level controllers 122 coupled to the networks 120. Each unit-level controller 122 is typically associated with a unit in a process system, which represents a collection of different machines operating together to implement at least part of a process. The unit-level controllers 122 perform various functions to support the operation and control of components in the lower levels. For example, the unit-level controllers 122 could log information collected or generated by the components in the lower levels, execute applications that control the components in the lower levels, and provide secure access to the components in the lower levels. Each of the unit-level controllers 122 includes any suitable structure for providing access to, control of, or operations related to one or more machines or other pieces of equipment in a process unit. Each of the unit-level controllers 122 could, for example, represent a server computing device running a MICROSOFT WINDOWS operating system. Although not shown, different unit-level controllers 122 could be used to control different units in a process system (where each unit is associated with one or more machine-level controllers 114, controllers 106, sensors 102a, and actuators 102b).

Access to the unit-level controllers 122 may be provided by one or more operator stations 124. Each of the operator stations 124 includes any suitable structure for supporting user access and control of one or more components in the system 100. Each of the operator stations 124 could, for example, represent a computing device running a MICROSOFT WINDOWS operating system.

At least one router/firewall 126 couples the networks 120 to two networks 128. The router/firewall 126 includes any suitable structure for providing communication between networks, such as a secure router or combination router/firewall. The networks 128 could represent any suitable networks, such as a pair of Ethernet networks or an FTE network.

In the Purdue model, "Level 4" may include one or more plant-level controllers 130 coupled to the networks 128. Each plant-level controller 130 is typically associated with one of the plants 101a-101n, which may include one or more process units that implement the same, similar, or different processes. The plant-level controllers 130 perform various functions to support the operation and control of components in the lower levels. As particular examples, the plant-level controller 130 could execute one or more manufacturing execution system (MES) applications, scheduling applications, or other or additional plant or process control applications. Each of the plant-level controllers 130 includes any suitable structure for providing access to, control of, or operations related to one or more process units in a process plant. Each of the plant-level controllers 130 could, for example, represent a server computing device running a MICROSOFT WINDOWS operating system.

Access to the plant-level controllers 130 may be provided by one or more operator stations 132. Each of the operator stations 132 includes any suitable structure for supporting user access and control of one or more components in the system 100. Each of the operator stations 132 could, for example, represent a computing device running a MICROSOFT WINDOWS operating system.

At least one router/firewall 134 couples the networks 128 to one or more networks 136. The router/firewall 134 includes any suitable structure for providing communication between networks, such as a secure router or combination router/firewall. The network 136 could represent any suitable network, such as an enterprise-wide Ethernet or other network or all or a portion of a larger network (such as the Internet).

In the Purdue model, "Level 5" may include one or more enterprise-level controllers 138 coupled to the network 136. Each enterprise-level controller 138 is typically able to perform planning operations for multiple plants 101a-101n and to control various aspects of the plants 101a-101n. The enterprise-level controllers 138 can also perform various functions to support the operation and control of components in the plants 101a-101n. As particular examples, the enterprise-level controller 138 could execute one or more order processing applications, enterprise resource planning (ERP) applications, advanced planning and scheduling (APS) applications, or any other or additional enterprise control applications. Each of the enterprise-level controllers 138 includes any suitable structure for providing access to, control of, or operations related to the control of one or more plants. Each of the enterprise-level controllers 138 could, for example, represent a server computing device running a MICROSOFT WINDOWS operating system. In this document, the term "enterprise" refers to an organization having one or more plants or other processing facilities to be managed. Note that if a single plant 101a is to be managed, the functionality of the enterprise-level controller 138 could be incorporated into the plant-level controller 130.

Access to the enterprise-level controllers 138 may be provided by one or more operator stations 140. Each of the operator stations 140 includes any suitable structure for supporting user access and control of one or more components in the system 100. Each of the operator stations 140 could, for example, represent a computing device running a MICROSOFT WINDOWS operating system.

Various levels of the Purdue model can include other components, such as one or more databases. The database(s) associated with each level could store any suitable information associated with that level or one or more other levels of the system 100. For example, a historian 141 can be coupled to the network 136. The historian 141 could represent a component that stores various information about the system 100. The historian 141 could, for instance, store information used during production scheduling and optimization. The historian 141 represents any suitable structure for storing and facilitating retrieval of information. Although shown as a single centralized component coupled to the network 136, the historian 141 could be located elsewhere in the system 100, or multiple historians could be distributed in different locations in the system 100.

In particular embodiments, the various controllers and operator stations in FIG. 1 may represent computing devices. For example, each of the controllers could include one or more processing devices 142 and one or more memories 144 for storing instructions and data used, generated, or collected by the processing device(s) 142. Each of the controllers could also include at least one network interface 146, such as one or more Ethernet interfaces or wireless transceivers. Also, each of the operator stations could include one or more processing devices 148 and one or more memories 150 for storing instructions and data used, generated, or collected by the processing device(s) 148. Each of the operator stations could also include at least one network interface 152, such as one or more Ethernet interfaces or wireless transceivers.

In accordance with this disclosure, various components of the system 100 support a process for an automated loop check in the system 100. For example, the controllers 104a-104b may represent field device controllers, and the process elements 102a-102b may represent field devices. Additional details regarding this functionality are provided below.

Although FIG. 1 illustrates one example of an industrial process control and automation system 100, various changes may be made to FIG. 1. For example, a control system could include any number of sensors, actuators, controllers, servers, operator stations, and networks. Also, the makeup and arrangement of the system 100 in FIG. 1 is for illustration only. Components could be added, omitted, combined, or placed in any other suitable configuration according to particular needs. Further, particular functions have been described as being performed by particular components of the system 100. This is for illustration only. In general, process control systems are highly configurable and can be configured in any suitable manner according to particular needs.

Figure 2:
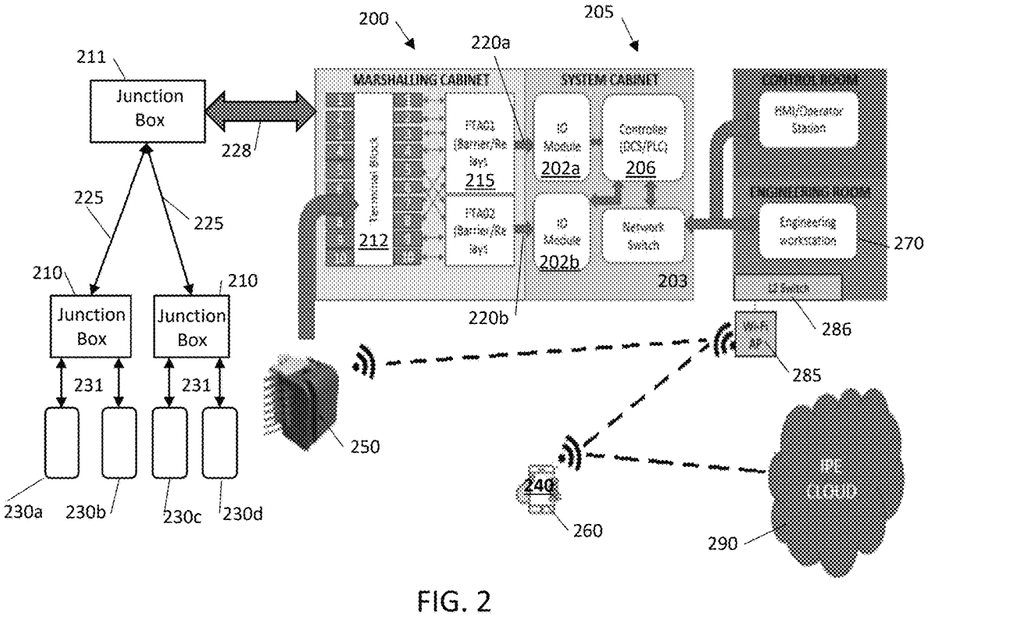
FIG. 2 illustrates an example system for the automated checking of I/O loops according to this disclosure.

FIG. 2 illustrates an example the marshalling cabinet 200 according to this disclosure. For ease of explanation, the marshalling cabinet 200 is described as being used in the system 100 of FIG. 1. For example, the marshalling cabinet 200 may be located between a system cabinet 205 housing controllers 106, and process elements 102a and 102b, and other hardware such as switch/firewall 110, or a combination of the components described in FIG. 1. However, the marshalling cabinet 200 could also be used in any other suitable system.

The marshalling cabinet 200 includes field termination block 212 and field termination relay hardware 215. Only one field termination block 212 is shown in FIG. 2 for ease of illustration, however, it is well known to those skilled in this art, that marshalling cabinets may containing a plurality of terminal blocks 212 housed in cabinet 200. The field termination block 212 connects wire cables between cabinet 200 and process elements, such as actuators, sensors and other process instruments installed in the automation system. The system cabinet 205 connects to the marshaling cabinet 200 via the field termination relay hardware 215 and wiring cables 220a and 220b. The marshalling cabinet 200, further connects to a plurality of junction boxes 210, and to a plurality of process instruments 230a-230d.

The marshalling cabinet 200 receives signals transmitted from one of the process instruments 230a-230d through a junction boxes 210 and cable bundles 225. Each process instrument 230a-230d is coupled to a respective junction box 210 via a cable 231. The cables 231 are bundled at the junction boxes 210 to form a cable bundle 225 upstream of the junction box 210. A junction box 211 can also be used to combine multiple cable bundles 225 into a single cable bundle 228, as illustrated between the junction box 211 and the marshalling cabinet 200.

Although FIG. 2 illustrates one example of a junction box 210, 211, various changes may be made to FIG. 2. For example, the number(s) and type(s) of components shown in FIG. 2 and the functional divisions of the junction boxes 210, 211, marshaling cabinet 200, system cabinet 205 and their included hardware shown in FIG. 2 are for illustration only. Various components in FIG. 2 could be omitted, combined, or further subdivided and additional components could be added according to particular needs.

The automated loop check system of the disclosure employees an intelligent dongle 250 arranged to connect to the terminal blocks of cabinet 200 such as terminal block 212 and simulate signals based on input/output information provided to the dongle 250 from operating software 240 operating in a mobile hand-held device 260. The dongle 250 can also be installed to terminal blocks in the junction boxes 210 in the same manner as will be explained for the terminal block 212 of the marshalling cabinet 200.

Operating software 240 is installed on a hand-held mobile device 260, for example, such as a cellular telephone, data pad, tablet, or hand-held computer operating any on an IOS an ANDROID or WINDOWS operating system. The operating software 240 controls the sequencing of execution of tests through dongle 250 based on personality information of each process instrument connected to the terminal block 212. The operating software 240 automatically generates an I/O loop check file using predefined library functions based on project engineering database input. The I/O loop check file is downloaded to dongle 250 for execution and testing of the I/O loops connected to the dongle 250.

The hand-held device 260 is connected via a wireless WI-FI or BLUETOOTH connection to the dongle 250. Additionally, the hand-held device 250 is further connected via a wireless WI-FI connection to an engineering workstation 270, as well as to the cloud 290 through WAP 285 mounted on L2 switch 286 as shown in FIG. 2. The cloud connections are through integrity policy enforcement (IPE) security that hosts a smart plant instrumentation (SPI) database that among other functions within an industrial process control and automation system design, defines the overall wiring connections between the sensors, actuators, controllers, servers, operator stations, and networks of the industrial process control and automation system.

Figure 3:
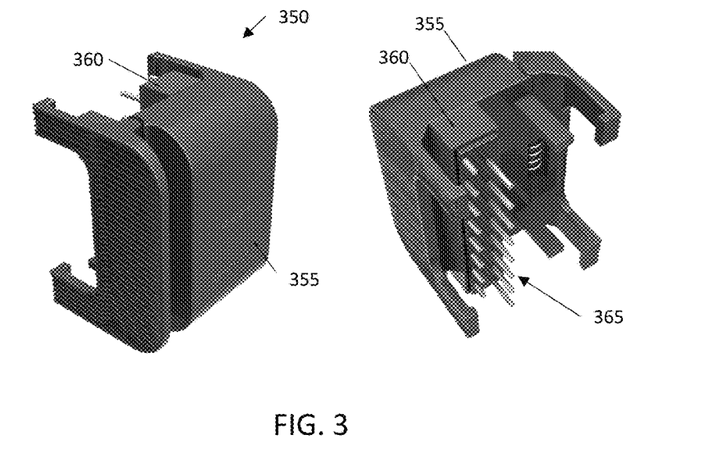
FIG. 3 is an example perspective view of the dongle according to this disclosure.

Turning know to FIG. 3, the dongle 350 of the disclosure is illustrated. Dongle 350 is comprised of an electronics section 355 and a separate terminal section 360. The terminal section 360 provides a snap-in arrangement of terminal pins 365. For example, in the terminal section 360 shown in FIG. 3, an 8-channel snap-in terminal section 360 has 16 terminal pins 365. Each terminal pin is adapted to engage with and establish an electrical connection to terminal sockets found in the terminal block 212. Various snap-in terminal pins 365 (not shown) can be installed in the terminal section 360 adapted to plug into specific electrical sockets of the terminal block 212. The terminal section 360 also includes an electrical connector (not shown) that engages a similar connector on the electronics section 355 that passes electrical signals between the terminal pins 365 and the electronic section 355 of the dongle 350.

Figure 4:
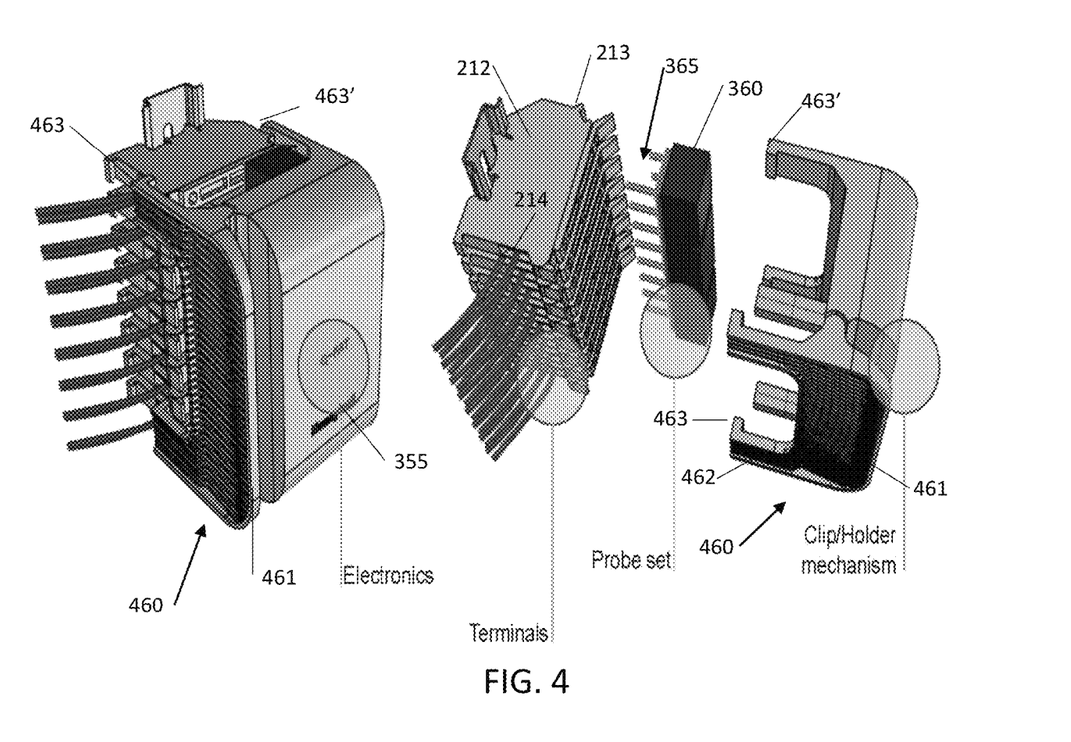
FIG. 4 is an example exploded perspective view of the dongle according to this disclosure.

As can be best seen at FIG. 4, the dongle 350 also includes a clip/holder mechanism 460 that is used to retain the dongle 350 securely to the terminal block 212. The clip/holder 460 is mounted to the dongle 350 in a manner that allows the clip arm 461 of holder mechanism 460 to be moved latterly away from the terminal block. Applying pressure to arm 461 moves members 462 and hooks 463 laterally away from the terminal block 212. The dongle is installed by inserting pins 365 into complementary electrical sockets in terminal block 212. Attaching hooks 463' to engage edge 213 of terminal block 212. Releasing the clip arm 461 allows hooks 463 to grab edge 214 of terminal block 212 and retain the dongle 350 on the terminal block 212 as is shown in FIG. 4. Lateral movement of the clip/holder can be accomplished, for example, with the use of a spring (not shown) which will allow the lateral movement of the clip arm 461 by physical manipulation or by use of a live hinge that is made from a thinner cross-section of the material making-up the housing of the dongle 350.

Figure 5:
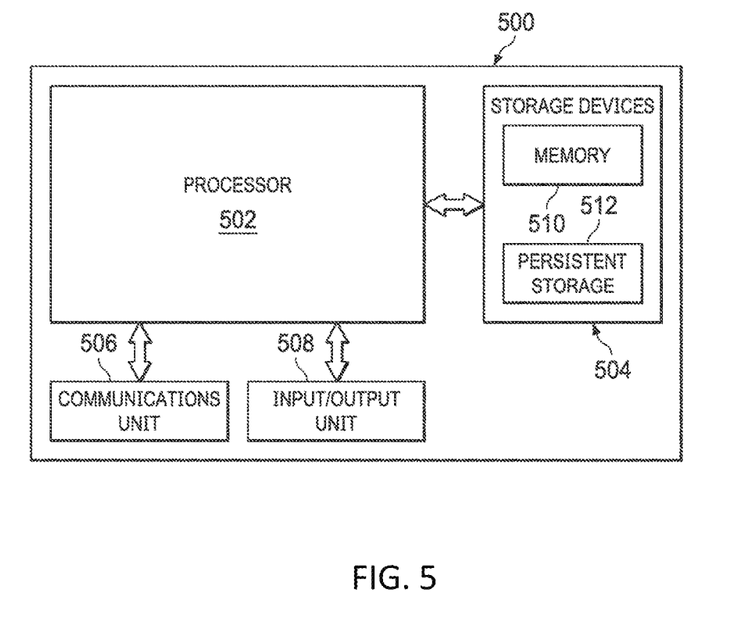
FIG. 5 illustrates an example electronics section of the dongle according to this disclosure.

The electronics section 355 of dongle 350 is shown schematically at FIG. 5. The electronics section 500 includes at least one processor 502, at least one storage device 504, at least one communications unit 506, and at least one input/output (I/O) unit 508. Processor 502 can execute instructions, such as those that may be loaded into memory 504. Processor 502 denotes any suitable processing device, such as one or more microprocessors, microcontrollers, digital signal processors, application specific integrated circuits (ASICs), field programmable gate arrays (FPGAs), or discrete circuitry.

The memory 510 and a persistent storage 512 are examples of storage devices, which represent any structure(s) capable of storing and facilitating retrieval of information (such as data, program code, and/or other suitable information on a temporary or permanent basis). The memory 510 may represent a RAM or any other suitable volatile or non-volatile storage device(s). The persistent storage 512 may contain one or more components or devices supporting longer-term storage of data, such as a ROM, and flash memory, or the like. Memory 510 can be used to store for example, the intermediate results of the operation of the processor 502 and the test files to be executed by dongle 350 as well as the results of the executed loop tests. The persistent storage may be used, for example, for storing the processor operating system, and the software for performing self-testing and calibration of the dongle 350.

The communications unit 506 supports communications with other systems or devices. For example, the communications unit 506 could include at least one network interface facilitating communications over a wireless communication protocol such as WI-FI or BLUETOOTH.

The I/O unit 508 allows for the input and output of data and is electrically connected through a connector (not shown) to the terminal section 360 of dongle 350. For example, the I/O unit 508 may provide a connection through the terminal section 360 for providing simulated I/O commands to a process instrument. The I/O unit 508 supports 8 channels of any I/O Type with functional 5-point analog test support. The I/O unit 508 drives signals to the I/O loops under test via the 8-channel terminal section 360 through the terminal block 212. The I/O unit 508 supports I/O configurations downloaded from the I/O loop operating software 240 such as analog input (AI), digital input (DI), digital output (DO), Analog Output (AO), Thermocouple/RTD, Low Level Multiplexing/Low Level analog input End of Line (LLMux/LLAI EOL) monitoring (Short/Open) and burnout detection.

Figure 6:
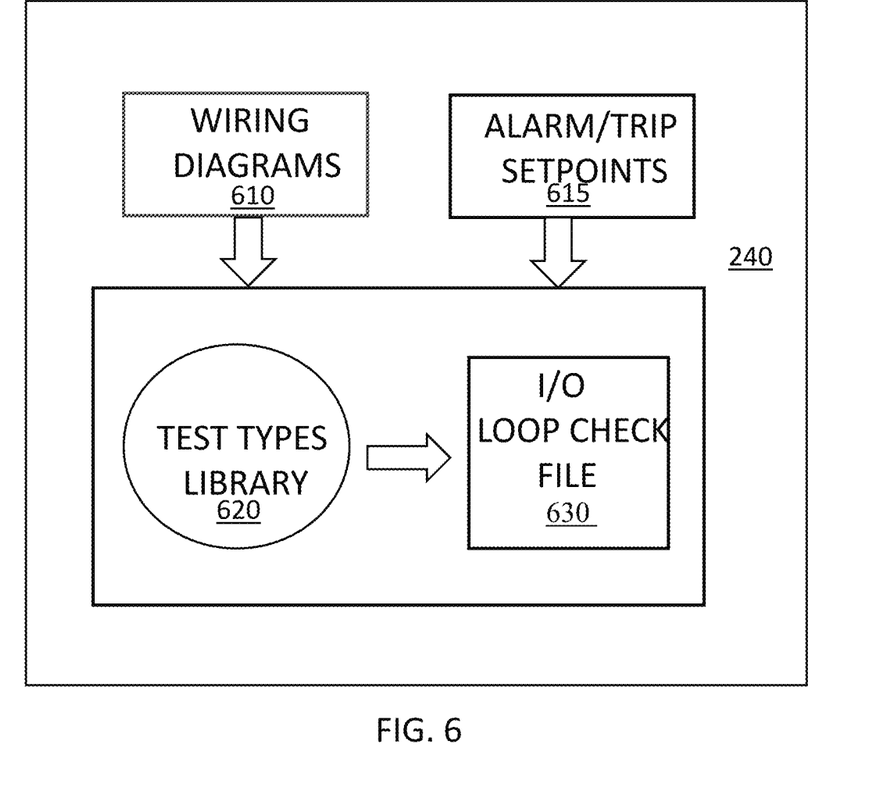
FIG. 6 illustrates an example method used by the operating software to build a loop check file according to this disclosure.

The execution of I/O loop tests by dongle 250 is based on the personality information of each I/O loop or I/O loop channel. The personality information is compiled from engineering data from the automation and control system and on inputs received from a smart plant instrumentation database (SPI). As shown on FIG. 6, a loop check file 630 is created automatically by the operating software 240 by importing to the operating software 240 wiring diagrams 610 of the wiring and cabling path between the marshalling cabinet 200, or junction box 210 and the process instruments 230a-230d to be tested. The wiring diagram 610 is provided and downloaded to the operating software 240 from a master wiring database from the project engineering workstation 270 or from an SPI located in the cloud 290. Alarm trip set points 615 are also input from the project engineering workstation 270 for the process instruments 230a-230d connected to the I/O loop channel under test. Next the type of test to be run is selected from a predefined library 620, for example, an analog input test or a digital input test. The wiring data 610 and alarm trip setpoints 615 and test types 620 build the I/O loop check file 630 which is downloaded to the dongle 350 via the WI-FI or BLUETOOTH wireless connection. The I/O loop check file 630 is the test image for the personality information of a specific I/O loop channel to be tested. The operating software 240 executing on the mobile device 260 enables and supervises the execution status of the dongles 250.

Figure 7:
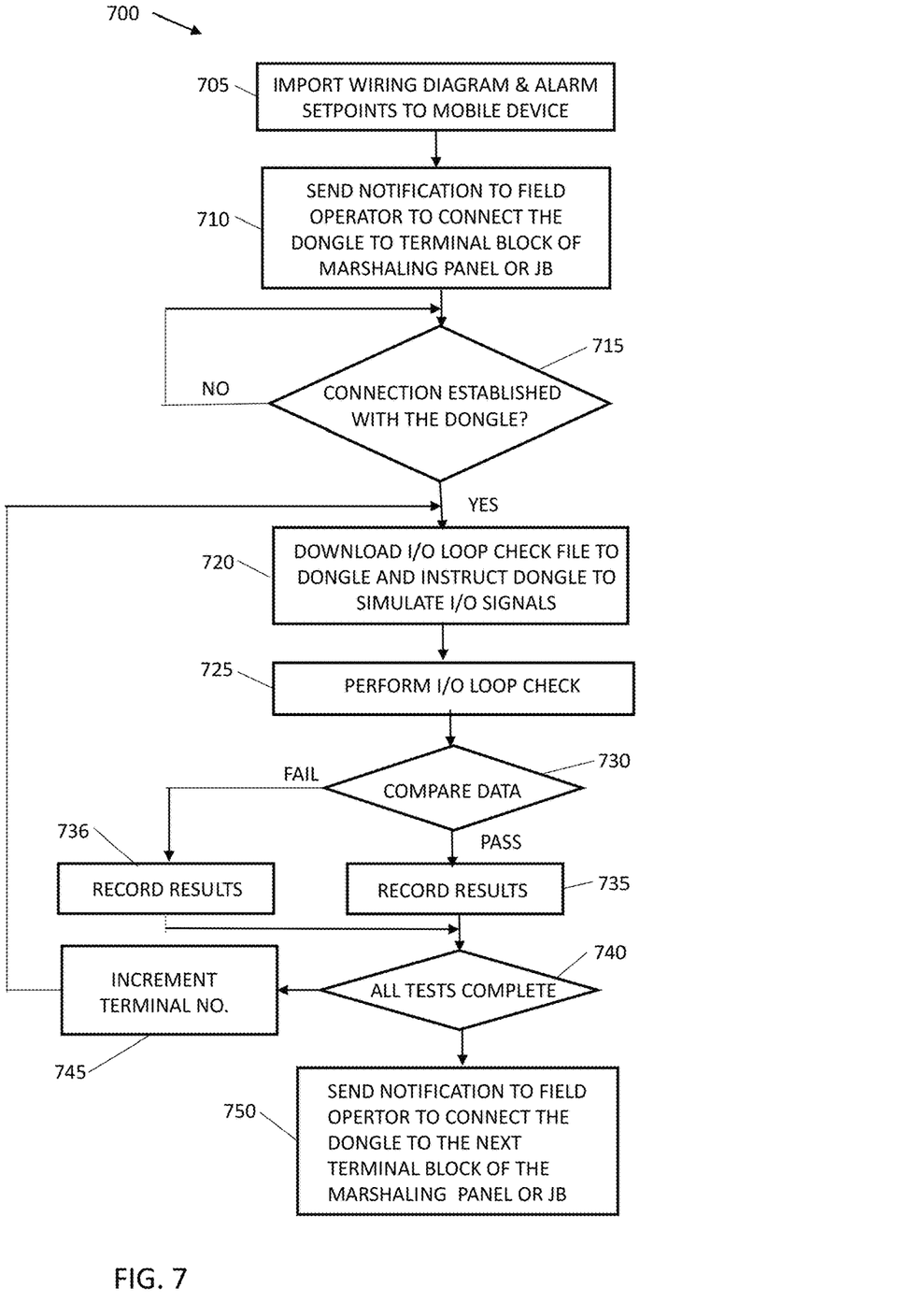
FIG. 7 illustrates an example method for the automated checking of I/O loops according to this disclosure.

FIG. 7 illustrates an example method 700 for automatic loop checking according to this disclosure. For ease of understanding, the method 700 is described with respect to the marshaling cabinet 200 in FIG. 2. However, the method 700 could be used by any suitable marshaling cabinet, field termination assembly or junction box and in any suitable system.

The method 700 includes block 705 in which the I/O channel personality image is downloaded to the operating software 240 from the engineering database and an I/O loop check file 630 is created. In block 710, the operating software 240 sends a notification to the display of the mobile device 260 instructing the field operator to connect the dongle 250 to the terminal block 212 of the marshaling panel 200. Once the dongle 250 is installed, the dongle 250 goes through a series of self-tests and attempts to establish a wireless WI-FI or BLUETOOTH connection with the mobile device 260. As is shown in block 715, if the dongle 250 fails to connect, the dongle attempts the connection again and repeats a connection attempt until a connection is established between the dongle 250 and the mobile device 260.

In block 720, upon establishing a wireless connection between the dongle 250 and the mobile device 260, the I/O loop check file 630 is downloaded from the operating software 240 to the dongle 250 and the dongle instructed to simulate the loop check to be performed. For example, if an analog input loop check is to be performed, the I/O unit 508 of the electronics section 355 sets up I/O circuitry to perform an analog loop check.

Next in block 725, the I/O loop test is performed for the I/O loop or I/O loop channel under test. In block 730, the dongle 250 tracks the test data which is compared to an expected result for the I/O loop test. If the results of the loop test pass, in block 735 the dongle sends the test results to the operating software where the results are recorded. The operating software 240 then determines, in block 740, if more I/O loops checks are to be performed for the terminal block that the dongle 250 is installed on, for example, a second I/O loop or I/O channel. The I/O channel number is incremented in block 745 and a second I/O loop check file 630 is downloaded to the dongle 250 for execution.

However, if an I/O loop fails its loop test, the dongle 250, in block 736 sends the failed results to the operating software 240 where the failure is recorded and a determination is made in block 740 if more loops checks are to be performed for the terminal block that the dongle is installed on. If one or more I/O loop tests are required to be made, the I/O channel number is incremented in block 745 and a second I/O loop check file is downloaded to the dongle 250 for execution.

In block 750, once all I/O loop tests are complete for all I/O loop channels connected to the dongle 250, a notification is displayed on the mobile device 260, for the field operator to install the dongle 250 to the next terminal block 212 of the marshalling panel 200. The dongle 250 in this embodiment is able to connect to eight I/O loops or I/O loop channels and perform eight I/O loop tests before requiring it to be moved to the next set of I/O loops to be tested.

Although FIG. 7 illustrates one example of a method for automatic loop checking, various changes may be made to FIG. 7. For example, while shown as a series of steps, various steps shown in FIG. 7 could overlap, occur in parallel, or occur multiple times. Moreover, some steps could be combined or removed, and additional steps could be added.

Figure 8:
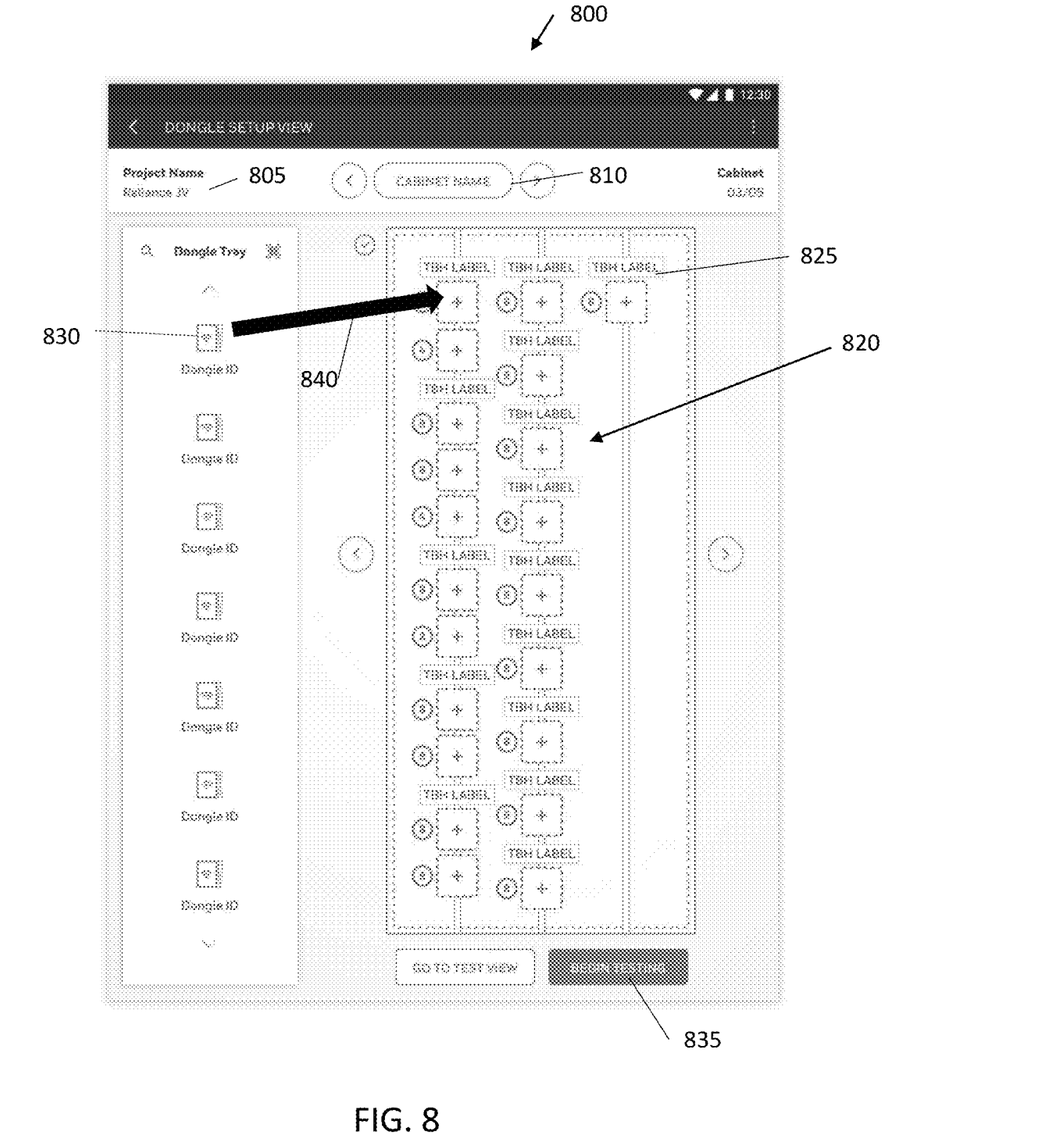
FIG. 8 is an example of a set-up display of the operating software for the automated checking of I/O loops according to this disclosure.

FIG. 8 shows a display 800 presented to the user on mobile device 260 by a user interface of operating software 240 to the field operator when setting up a dongle 250. The display 800 includes information 805 identifying the industrial process control and automation system, the name of the marshalling cabinet 810 and a pane including thumbnail images 820 of the terminal blocks installed in the cabinet. Each terminal block thumbnail 820 can have a unique name associated with it, which would be shown as label 825 over the specific terminal blocks thumbnail 820. On the left side of the screen a dongle tray is displayed with a series of thumbnail images representing dongles, such as dongle thumbnail 830. Each dongle thumbnail 830 would be associated with a particular I/O loop check file 630 that has been completed by the operating software 240. Each dongle thumbnail 830 therefore would represent a personality image of the I/O loop check file 630 built to be executed for a specific terminal block 820. Each dongle is further identified by a specific ID. For example, the ID could be a specific numeral representing the dongle or a unique alphanumeric name.

In order to run an automated I/O loop check the appropriate dongle thumbnail 830 from the dongle tray is dragged and dropped on a specific terminal block thumbnail 820 to be tested as shown by arrow 840. The dongle thumbnail 830 can be dragged and dropped on a selected terminal block using for example, the field operator's finger, a stylus, track pad or by other means for completing the selection such as using modern input/output mechanisms such as drop-down menus and mouse right-clicks. Testing is started when the "begin testing" button 835 is pressed. The I/O loop check file 630 is then downloaded to the dongle 250 associated with the terminal block selected and the I/O loop testing started.

Figure 9:
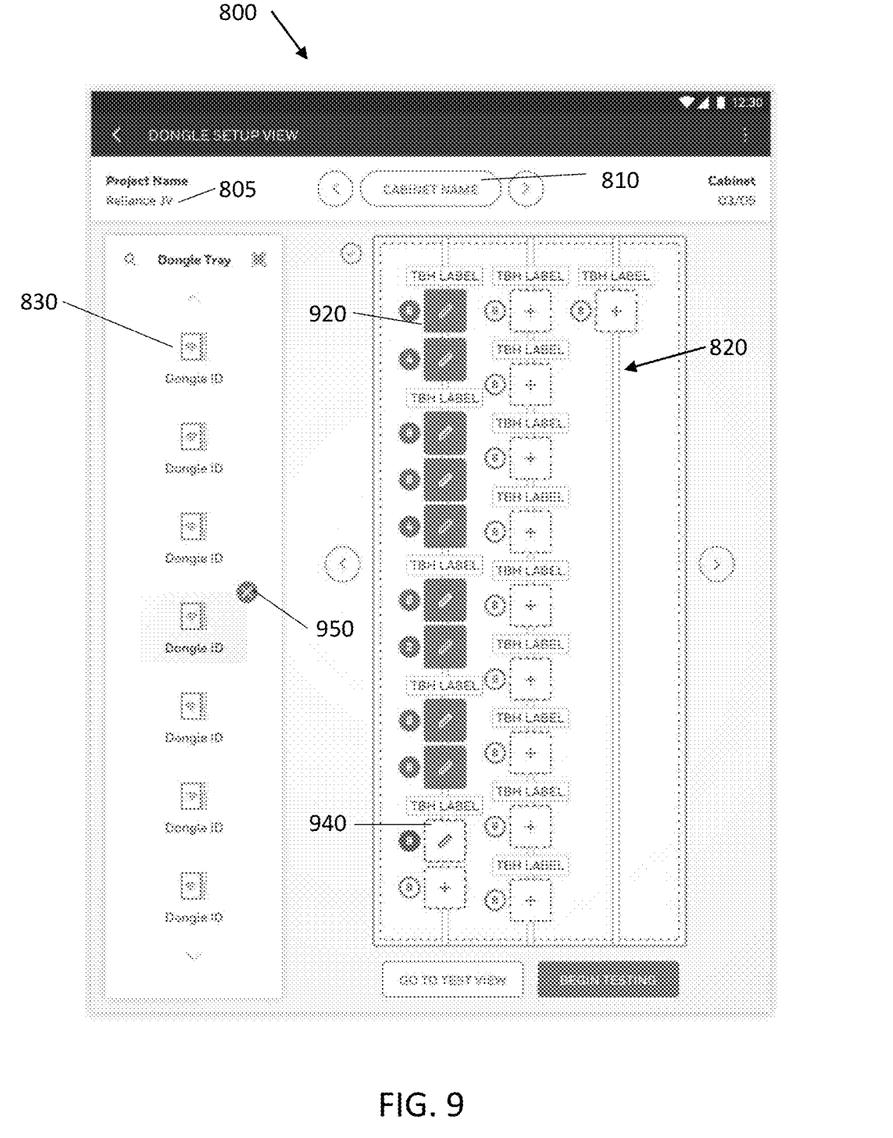
FIG. 9 is an example of a display of output from the operating software for the automated checking of I/O loops according to this disclosure.

As can be seen in FIG. 9, once a dongle thumbnail 830 is associated with a terminal thumbnail 820 the terminal block changes from a dashed line square to a solid square 920 signifying that a dongle and a loop check file has been associated with the terminal block. I/O loop checks completed successfully, are indicated by a solid image color as shown. However, upon a failure of a I/O loop check, the terminal block thumbnail 940 indicates a failed state by displaying a failure color and the dongle image ID associated with the loop failure is marked and identified 950 for later troubleshooting by the field operator.

Figure 10:
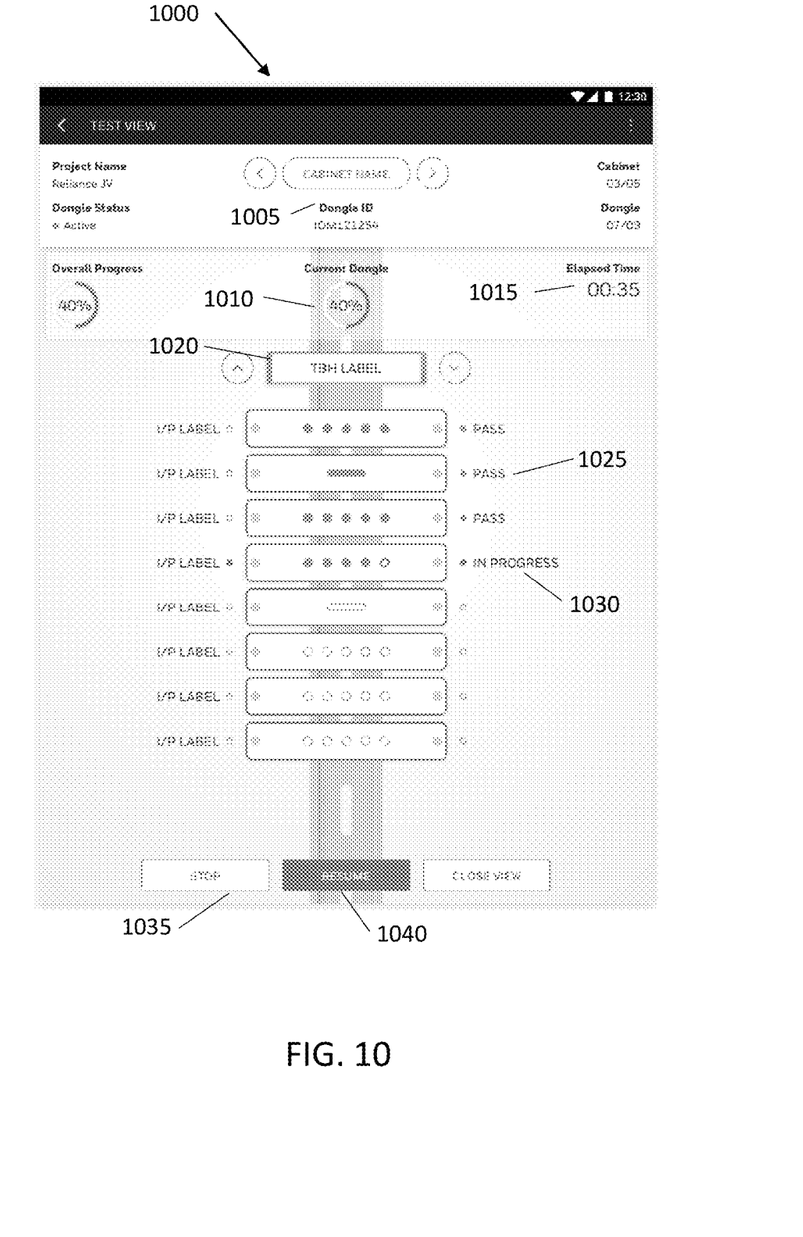
FIG. 10 is an example of a display of output from the operating software for the automated checking of I/O loops according to this disclosure.

FIG. 10 illustrates a display 1000 presented to the user on the mobile device 260 by the graphic user interface of operating software 240 when the dongle 250 is physical installed on terminal block 212 and executing the I/O loop checks. The dongle ID 1005 is indicated on the screen display header. As is shown in FIG. 10, a pictorial representation of the terminal block 212 is displayed showing, in this example, eight I/O loop channels being tested. Each I/O loop channel signifying an I/O loop being tested by an I/O loop check file 630. Overall progress of the tests being run by the dongle 250 is shown in the screen header by display 1010 as well as the elapsed time of the test at 1015. The terminal block under test is also identified by a label 1020 that identifies the terminal block being tested. Each channel includes indication if an I/O loop check has passed the testing 1025, is in progress 1030, or failed (not shown). The tests can be stopped and or resumed using the function buttons 1035, 1040 respectively on the bottom of the screen.

Reports for each I/O loop test is recorded by the operating software 240 and uploaded to the project engineering diabase at an engineering workstation 270 or to the cloud 290. The test results are validated automatically and can be retrieved at any time. Once a dongle 250 is associated with a terminal block 212 and a I/O loop check started, the system performs the I/O loop checks automatically without the need of a test engineer or field operator to watch over the testing. Further, I/O loop checks can be performed overnight and can be perform on multiple systems at the same time.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

The description in this patent document should not be read as implying that any particular element, step, or function is an essential or critical element that must be included in the claim scope. Also, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," "processing device," or "controller" within a claim is understood and intended to refer to structures known to those skilled in the relevant art, as further modified or enhanced by the features of the claims themselves, and is not intended to invoke 35 U.S.C. § 112(f).

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
    a field terminal block including a terminal block that includes a plurality of terminal sockets connected to a plurality of I/O loops;
    a dongle configured to be installed on the field terminal block and configured to make an electrical connection to at least one input/output (I/O) loop;
    a mobile hand-held device including an operating software in communication with the dongle and to a database of I/O loop data, wherein:
        the operating software is configured to use the database of I/O loop data to construct an I/O loop check file; and
        the dongle is configured to download the I/O loop check file, for execution and testing of the at least one I/O loop based on a personality information of each I/O loop of the plurality of I/O loops,
    wherein the dongle includes:
        an electronics section configured to receive and run the I/O loop check file for each of the plurality of I/O loops; and
        a terminal section electrically connected to the electronics section and comprising a plurality of electrical connectors, the terminal section including a plurality of pins arranged to be received by, and make electrical connections to, the plurality of terminal sockets of the terminal block and the plurality of I/O loops, wherein the plurality of electrical connectors engage with other connectors on the electronics section that passes electrical signals between the plurality of pins and the electronic section of the dongle; and
        a holder for retaining the dongle to the terminal block, the holder having first hooks and a movable clip arm having second hooks, wherein the dongle is retained to the terminal block by engaging the first hooks of the holder to a first edge of the terminal block and moving the clip arm to allow the second hooks to grab a second edge of terminal block, wherein the terminal section of the dongle is configured to be arranged between the holder and the terminal block, and wherein the holder is configured to be arranged between the terminal section of the dongle and the electronic section of the dongle.

2. The system of claim 1, wherein the dongle is further configured to connect an individual I/O loop check file sequentially to an individual I/O loop of the plurality of I/O loops through a specific set of terminal pins to test each of the plurality of I/O loops.

3. The system of claim 1, wherein the operating software is configured to be executed in the mobile hand-held device, the mobile hand-held device communicating to the dongle and to the database of the I/O loop data wirelessly.

4. The system of claim 3, further comprising:
    an engineering workstation; and
    a wireless access point, wherein:
        the database of I/O loop data is contained in an engineering database, the engineering database located in the engineering workstation; and
        the mobile hand-held device is wirelessly connected to the wireless access point associated with the engineering workstation and to the engineering database.

5. The system of claim 4 further comprising a cloud, wherein:
    the database of I/O loop data is contained in the engineering database, the engineering database hosted in the cloud; and
    the mobile hand-held device is wirelessly connected to the cloud and to the engineering database.

6. The system of claim 5, wherein the mobile hand-held device, the dongle, the wireless access point and the cloud communicate bi-directionally with each other wirelessly using WI-FI signaling.

7. The system of claim 5, wherein the mobile hand-held device, the dongle, the wireless access point and the cloud communicate bi-directionally with each other wirelessly using BLUETOOTH signaling.

8. The system of claim 1, wherein the field terminal block is located in a marshalling cabinet or a field termination assembly associated with the system.

9. A method comprising:
    installing a dongle on a field terminal block to make an electrical connection with at least one input/output (I/O) loop;
    connecting a plurality of I/O loops to a plurality of terminal sockets on the field terminal block;
    generating an I/O loop check file using an operating software in a mobile hand-held device that communicates with the dongle and with a database of I/O loop data, the operating software configured to use the database of I/O loop data to generate the I/O loop check file;
    receiving the I/O loop check file for each of the plurality of I/O loops by an electronic section of the dongle;
    establishing an electrical connection between a terminal section of the dongle and the electronic section, the terminal section including a plurality of electrical connectors and a plurality of pins arranged to be received by, and make electrical connections to the plurality of terminal sockets and the plurality of I/O loops, wherein the plurality of electrical connectors engage with other connectors on the electronics section that passes electrical signals between the plurality of pins and the electronic section of the dongle;
    downloading the I/O loop check file to the dongle, wherein the dongle is configured to execute and test the at least one I/O loop based on a personality information of each I/O loop of the plurality of I/O loops;
    running the I/O loop check file for the execution and testing of the I/O loop; and
    a holder for retaining the dongle to the terminal block through a holder, the holder having first hooks and a movable clip arm having second hooks, wherein the dongle is retained to the terminal block by engaging the first hooks of the holder to a first edge of the terminal block and moving the clip arm to allow the second hooks to grab a second edge of terminal block, wherein the terminal section of the dongle is configured to be arranged between the holder and the terminal block, and wherein the holder is configured to be arranged between the terminal section of the dongle and the electronic section of the dongle.

10. The method of claim 9, further comprising:
downloading an individual I/O loop check file for each of the plurality of I/O loops to execute and test each of the plurality of I/O loops.

11. The method of claim 9, further comprising:
executing the operating software on the mobile hand-held device, the mobile hand-held device communicating with the dongle and the database of I/O loop data wirelessly.

12. The method of claim 11, further comprising:
providing in an engineering workstation an engineering database containing the database of the I/O loop data; and
connecting the mobile hand-held device to the engineering workstation and the engineering database through a wireless access point communicatively connected to the engineering workstation.

13. The method of claim 11, further comprising:
providing an engineering database in a cloud, the engineering database containing the database of I/O loop data; and
wirelessly connecting the mobile hand-held device to the cloud and the engineering database.

14. The method of claim 9, further comprising:
providing the field terminal block in a marshalling cabinet or a field termination assembly.

15. A system comprising:
a field terminal block having a plurality of terminal sockets, the terminal sockets connected to at least one input/output (I/O) loop;
a dongle having an electronic section and a terminal section communicatively connected with each other, the terminal section including a plurality of electrical connectors and a plurality of pins arranged to be received by and make electrical connections to, the terminal sockets of the terminal block; and
a mobile hand-held device configured to run an operating software that wirelessly communicates with the electronic section of the dongle and to a database of I/O loop data, wherein:
the operating software is configured to use the database of I/O loop data to construct an I/O loop check file;
wherein the dongle is configured to execute and test the at least one I/O loop based on a personality information of each I/O loop;
the mobile hand-held device configured to download to the electronic section of the dongle the I/O loop check file, wherein the electronic section of the dongle executes the I/O loop check file testing the at least one I/O loop by applying test signals through selective terminal pins to the terminal sockets connected to the at least one I/O loop, wherein the terminal section includes an electrical connector that engages other connector on the electronics section that passes electrical signals between the plurality of pins and the electronic section of the dongle; and
a holder for retaining the dongle to the terminal block, the holder having first hooks and a movable clip arm having second hooks, wherein the dongle is retained to the terminal block by engaging the first hooks the holder to a first edge of the terminal block and moving the clip arm to allow the second hooks to grab a second edge of terminal block, wherein the terminal section of the dongle is configured to be arranged between the holder and the terminal block, and wherein the holder is configured to be arranged between the terminal section of the dongle and the electronic section of the dongle.

16. The system of claim 15, wherein the electronic section further includes:
a processor for executing instructions for conducting an I/O loop test;
an I/O circuit connected to the processor and the terminal section of the dongle and the terminal pins, the I/O circuit configured to send signals to the plurality of pins based on type of loop testing to be accomplished; and
a communication circuit connected to the processor and to a network interface that communicates wirelessly to the mobile hand-held device;
wherein the communication circuit passes the I/O loop check file received from the mobile hand-held device to the processor, the processor executing the I/O loop check file and configuring the I/O loop to send test signals specific to the type of test to be conducted to the terminal pins.

17. The system of claim 16, wherein the electronic section of the dongle further includes:
a memory device, the memory device connected to the processor and configured to store the I/O loop check file and results of the I/O loop test for transmission of the results of the I/O loop test by the communication circuit to the mobile hand-held device and the operating software.

18. The system of claim 15 further comprising an engineering database, wherein results of the I/O loop test is passed to the engineering database, the engineering database located in a remote location, the mobile hand-held device wirelessly connecting to the engineering database at the remote location to upload the results of the I/O loop test to the engineering database.

* * * * *